(12) United States Patent
Schroader

(10) Patent No.: US 7,601,921 B2
(45) Date of Patent: Oct. 13, 2009

(54) EMI SHIELDING CONTAINERS

(76) Inventor: Amber Schroader, 4013 Kaplua Hills, Cedar Hills, UT (US) 84062

( * ) Notice: Subject to any disclaimer, the term of this patent is extended or adjusted under 35 U.S.C. 154(b) by 0 days.

(21) Appl. No.: 12/177,036

(22) Filed: Jul. 21, 2008

(65) Prior Publication Data

US 2008/0277156 A1    Nov. 13, 2008

Related U.S. Application Data

(63) Continuation of application No. 11/201,961, filed on Aug. 11, 2005, now abandoned.

(51) Int. Cl.
*H01R 4/56* (2006.01)
*H05K 9/00* (2006.01)

(52) U.S. Cl. ............ 174/372; 174/380; 174/382; 361/816; 340/572.8

(58) Field of Classification Search ............ 174/377, 174/372, 373, 380, 382; 361/816, 818; 340/572.8
See application file for complete search history.

(56) References Cited

U.S. PATENT DOCUMENTS

| | | | |
|---|---|---|---|
| 5,136,119 A * | 8/1992 | Leyland | 174/379 |
| 5,791,485 A | 8/1998 | Carbonneau | |
| 6,140,576 A | 10/2000 | Kanne et al. | |
| 7,075,798 B2 * | 7/2006 | Hendrickson | 361/818 |
| 2005/0118366 A1 | 6/2005 | Piemonte et al. | |
| 2006/0044206 A1* | 3/2006 | Moskowitz et al. | 343/841 |
| 2006/0254815 A1* | 11/2006 | Humphrey et al. | 174/380 |
| 2007/0131323 A1* | 6/2007 | Stewart-Stand | 150/131 |

FOREIGN PATENT DOCUMENTS

| | | | |
|---|---|---|---|
| DE | 19713821 | * | 10/1998 |
| EP | 0 266 869 | | 5/1988 |
| JP | 03-89175 | * | 4/1991 |
| JP | 8-270264 | * | 10/1996 |
| WO | WO 01/03313 A1 | | 1/2001 |

OTHER PUBLICATIONS

Bonn. Sep. 16, 2002. Dixel Electronics Ltd. Israel. Shieldex Trading US. <http://www.dixel.co.il/emishielding/pdf/bonn.pdf>.
Bonn. Sep. 16, 2002. Statex Productions & Vertriebs GmbH. Shieldex Trading GmbH. <http://www.shieldextrading.com/images/pdfs/bonn.pdf>.
Boston. Oct. 10, 2002. Dixel Electronics Ltd. Israel. Shieldex Trading US. <http://www.dixel.co.il/emishielding/pdf/boston.pdf>.

(Continued)

*Primary Examiner*—Hung V Ngo
(74) *Attorney, Agent, or Firm*—Morriss O'Bryant Compagni, P.C.

(57) ABSTRACT

Embodiments of electromagnetic interference (EMI) shielding containers are disclosed according to the present invention. The EMI shielding containers are especially useful for protecting sources of electronic evidence from EMI contamination prior to data extraction. However, the embodiments of EMI shielding containers of the present invention may be used in any context where a wireless device is to be shielded from transmitting or receiving electromagnetic signals. Embodiments of methods of using EMI shielding containers to extract data from electronic devices are also disclosed.

19 Claims, 7 Drawing Sheets

OTHER PUBLICATIONS

Boston. Oct. 10, 2002. Statex Productions & Vertiebs GmbH. Shieldex Trading GmbH. <http://www.shieldextrading.com/images/pdfs/Boston.pdf>.

Kiel. Oct. 14, 2002. Dixel Electronics Ltd. Israel. Shieldex Trading US. <http://www.dixel.co.il/emishielding/pdf/kiel.pdf>.

Kiel. Oct. 10, 2002. Statex Productions & Vertriebs GmbH. Shieldex Trading GmbH. <http://www.shieldextrading.com/images/pdfs/Kiel.pdf>.

Nice. Sep. 29, 2004. Dixel Electronics Ltd. Israel. Shieldex Trading US. <http://www.dixel.co.il/emishielding/pdf/nice.pdf>.

Nice. Oct. 10, 2002. Statex Productions & Vertriebs GmbH. Sheildex Trading GmbH. <http://www.dixel.co.il/emishielding/pdf/nice.pdf>.

*Nickel-Silver Conductive Shieldex Fabric*. Mar. 8, 2004. Statex Productions & Vertriebs GmbH. Shieldex Trading GmbH. <http://www.shieldextrading.com/images/pdfs/NiAg%20woven%20ripstop.pdf>.

Nora. Sep. 19, 2002. Dixel Electronics Ltd. Israel. Shieldex Trading US. <http://www.dixel.co.il/emishielding/pdf/nora.pdf>.

Nora. Sep. 19, 2002. Statex Productions & Vertriebs GmbH. Shieldex Trading GmbH. <http://www.shieldextrading.com/images/pdfs/nora.pdf>.

Nora II. Sep. 19, 2002. Statex Productions & Vertriebs GmbH. Shieldex Trading GmbH. <http://www.shieldextrading.com/images/pdfs/norall/pdf/>.

Norden. Oct. 14, 2002. Dixel Electronics Ltd. Israel. Shieldex Trading US. <http://www.dixel.co.il/emishielding/pdf/norden.pdf>.

Norden. Oct. 14, 2002. Statex Productions & Vertriebs GmbH. Shieldex Trading GmbH. <http://www.shieldextrading.com/images/pdfs/Norden.pdf>.

Tülle. Oct. 6, 2003. Statex Productions & Vertriebs GmbH. Shieldex Trading GmbH. <http://www.shieldextrading.com/images/pdfs/Tulle.pdf>.

*Metalized Fabric*. 2002. Sheildex Trading, Inc. <http://www.shieldextrading.com/metalicizedfab.htm>.

*Mobile Cloak™ mCloak, Wireless Privacy and Security*. Mobile Cloak. <http://www.mobilecloak.com/mobilecloak/>, Jul. 27, 2005.

*Cloaktec™ RFI / EMI Sheilding Wireless Signals*. Mobile Cloak. <http://www.mobilecloak.com/shield/index.html>, Jul. 27, 2005.

*mCloak™ r5 Wireless Privacy and Security for 802.11, Bluetooth, RFID tags*. Mobile Cloak. <http://www.mobilecloak.com/mobilecloak_r5.html>, Jul. 27, 2005.

*MedCloak™r5 Wireless Privacy and Security for 802.11, Bluetooth, RFID tags*. Mobile Cloak. <http://www.mobilecloak.com/medcloak/index.html>, Jul. 27, 2005.

*About MobileCloak™ Wireless Privacy and Security*. Mobile Cloak. <http://www.mobilecloak.com/about/>, Jul. 27, 2005.

*Wireless Privacy and Security Made Simple. Mobile Cloak*. <http://www.mobilecloak.com/block_signal/>, Jul. 27, 2005.

*Mobile Wireless Security and Privacy*. Mobile Cloak. <http;//www.mobilecloak.com/privacy/>, Oct. 6, 2005.

*Paraben's Wireless StrongHold Tent*. 2004-2005. Paraben Corporation. <http://www.paraben-forensics.com/catalog/product_info.php?cPath=26&products_id=174>.

*Paraben's Wireless StrongHold Bag*. 2004-2005. Paraben Corporation. <http://www.paraben-forensics.com/catalog/product_info.php?cPath=26&products_id=173>.

\* cited by examiner

EMI SHIELDING CONTAINERS

The present application is a continuation of U.S. application Ser. No. 11/201,961 filed on Aug. 11, 2005, currently pending.

BACKGROUND OF THE INVENTION

1. Field of the Invention

This invention relates generally to electromagnetic interference (EMI) shields, and more specifically relates to pouches and tents for use in shielding electronics from EMI and wireless communication signals.

2. Description of Related Art

It is well known that electromagnetic signals propagate through vacuum with little signal attenuation. It is also well known that electromagnetic radiation and signals attenuate when propagating through materials other than a vacuum. Electromagnetic signals rapidly attenuate in metal materials. For this reason, metal housings are commonly used to hold electronic equipment in order to minimize EMI caused by the electronics associated with the electronic equipment when operating. While metal housing are useful for shielding electronic objects, they are generally bulky, heavy, non-portable and not suitable for containing arbitrarily sized electronic objects.

U.S. Pat. No. 5,791,485 to Carbonneau discloses an electrostatic discharge protection bag that included a multilayer film with metalization sandwiched between antistatic films that is designed to protect an electronic circuit card or module from electrostatic discharge and has some limited EMI attenuation. The metalized layer used in the Carbonneau bag is available from Metalization Products, Winchester, Mass. The Carbonneau bag also includes a layer of bubble pack cushioning material for mechanical protection of the circuit card.

U.S. Patent Application Publication No. US 2005/0118366 to Piemonte et al. discloses containers made barrier materials. External layers of the Piemonte et al. container may include Aluminum and Copper metallization layers on a polymer substrate for EMI shielding. The Piemonte et al. container also includes a vapor barrier layer sandwiched between the external metallization layers to resist transmission of $O_2$, $H_2O$ and $CO_2$ or any other vapor desired to be blocked.

U.S. Pat. No. 6,140,576 to Kanne et al. discloses a portable tent structure for protecting electronic assemblies during various stages of a manufacturing process. The Kanne et al. tent includes a collapsible frame for supporting a protective covering that creates an EMI shield around the object inside the tent. The protective covering of the Kanne et al. tent includes a foil layer and a carrier layer, e.g., polyester that may be fabricated as cloth interwoven with various metallic threads.

An EMI shield would also be useful when gathering electronic forensic evidence. For example, when a portable wireless device is initially seized from its owner, it is important to ensure that proper wireless procedures are maintained and that the evidence is protected from potential mistakes that destroy the validity or credibility of the evidence, particularly from after seizure wireless communications. Thus, there is a need in the art for a container for storing a portable wireless device and yet that would allow controlled extraction of the data on the portable wireless device without allowing EMI to corrupt the data or evidence in the portable wireless device.

The Carbonneau and Piemonte et al. containers are not designed to provide for external connection to evidence gathering devices while shielding the portable wireless device containing the evidence of interest. Furthermore, the Carbonneau bag includes a layer of bubble pack cushioning material for mechanical protection of electrical object inside which is generally unnecessary in the forensic evidence gathering context and adds cost to the EMI container. Similarly, the Piemonte et al. container includes an unnecessary vapor barrier layer that ads cost.

The Kanne et al. tents are sized to protect satellites and other bulky electronic objects. But, it would be desirable to have an EMI shield that would completely contain a user seated with forensic data extraction equipment connected to the electronic device of interest during evidence extraction, that includes a floor and that provides a means of ingress and egress to and from the inside of the EMI shield tent and methods of using same, to extract the forensic evidence, i.e., data.

Thus, there exists a need in the art for EMI shielding containers that can be used in the context of gathering electronic data from the shielded electronic device for forensic evidence that are not disclosed in the prior art.

BRIEF SUMMARY OF THE INVENTION

An embodiment of an electromagnetic interference (EMI) shielding container according to the present invention is disclosed. The EMI shielding container may include an outer layer comprising a metalized fabric having an inside and an outside. The EMI shielding container may further include an internal pocket comprising the metalized fabric disposed on the inside of the outer layer and configured for enclosing an electronic object. The EMI shielding container may further include a closure formed along the periphery of the inside of the outer layer configured to collapse the inside of the outer layer on itself and around the internal pocket in a closed configuration and that is also releasable to gain access to the electronic object.

An embodiment of a portable electromagnetic interference (EMI) shielding container according to the present invention is disclosed. The portable EMI shielding container may include a metalized fabric covering and a framework for supporting the metalized fabric covering to form a tent structure enclosing a room, the room configured large enough to contain a user, a data extraction device and an electronic object being shielded. The portable EMI shielding container may further include a closable external opening in the metalized fabric covering allowing ingress and egress to the room, wherein the closable external opening may be sealed with a flap of the metalized fabric covering. Embodiments of methods of using EMI shielding containers to extract forensic data from an electronic object are also disclosed.

Additional features and advantages of the invention will be apparent from the detailed description which follows, taken in conjunction with the accompanying drawings, which together illustrate, by way of example, features of embodiments of the present invention.

BRIEF DESCRIPTION OF THE SEVERAL VIEWS OF THE DRAWINGS

The following drawings illustrate exemplary embodiments for carrying out the invention. Like reference numerals refer to like parts in different views or embodiments of the present invention in the drawings.

DETAILED DESCRIPTION OF THE INVENTION

Embodiments of electromagnetic interference (EMI) shielding containers are disclosed according to the present invention. The EMI shielding containers are especially useful for protecting sources of electronic evidence from EMI contamination prior to data extraction. However, the embodiments of EMI shielding containers of the present invention may be used in any context where a wireless device is to be shielded from transmitting or receiving electromagnetic signals. Embodiments of methods of using EMI shielding containers to extract data from electronic devices are also disclosed.

Figure 1:
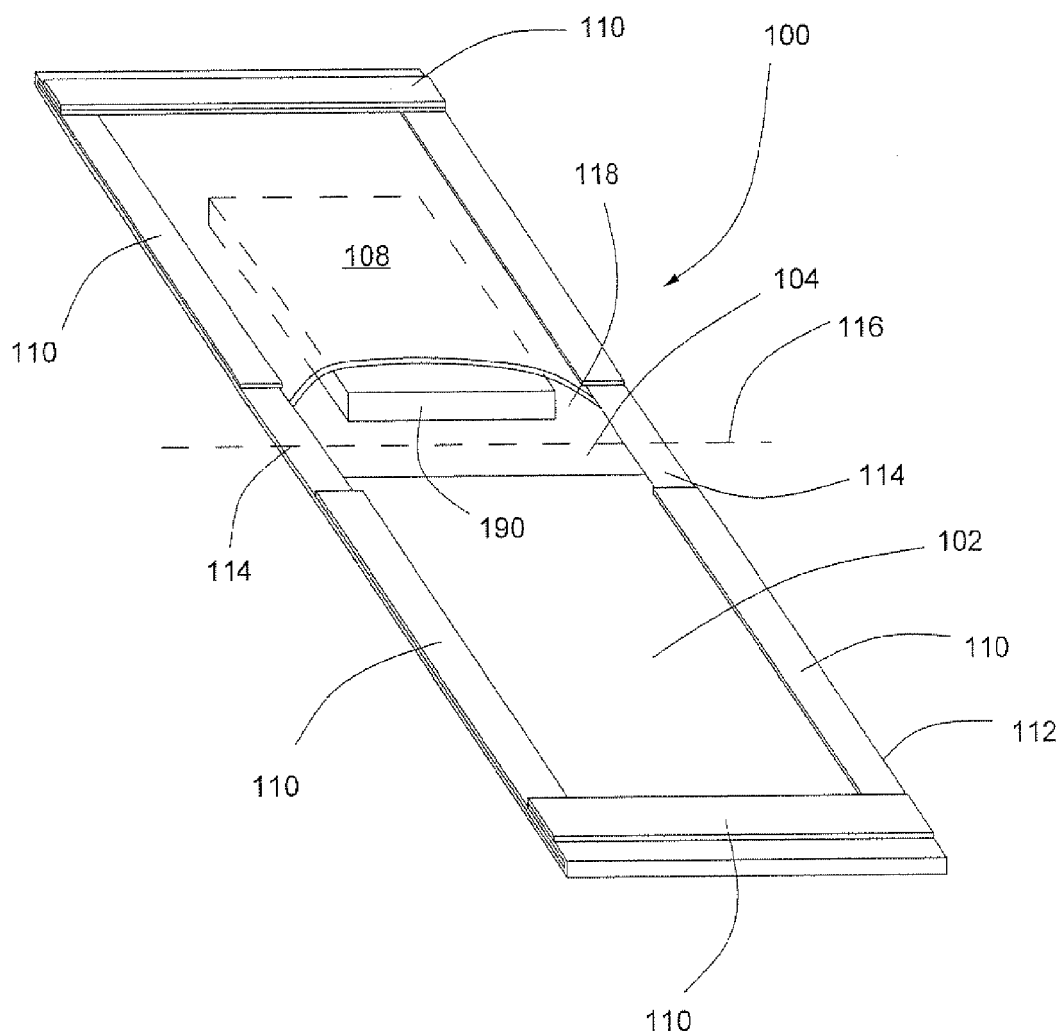
FIG. 1 is a perspective view of an embodiment of an electromagnetic interference (EMI) shielding container in an open configuration according to the present invention.
Figure 2:
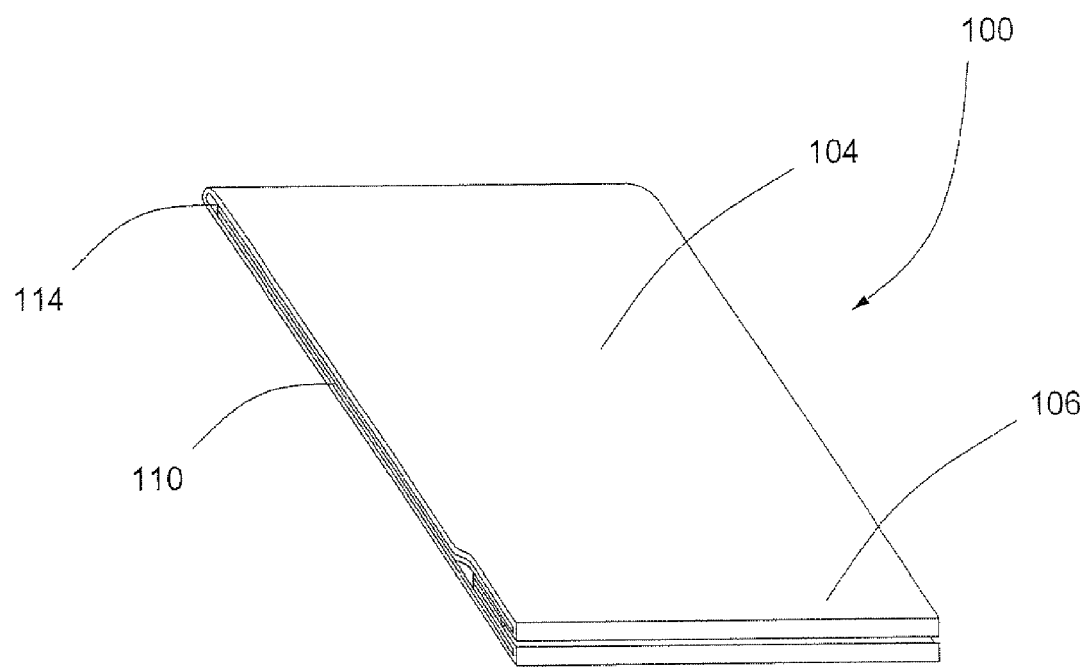
FIG. 2 is a perspective view of an embodiment of an electromagnetic interference (EMI) shielding container in a closed configuration according to the present invention.

FIGS. 1 and 2 are a perspective views of an embodiment of an electromagnetic interference (EMI) shielding container 100 in open and closed configurations, respectively, according to the present invention. EMI shielding container 100 may include an outer layer 102 comprising a metalized fabric having an inside 104 and an outside 106 (not shown in FIG. 1 because hidden from view, but, see FIG. 2) according to this embodiment of the present invention. EMI shielding container 100 may also include an internal pocket 108 comprising the metalized fabric disposed on the inside 104 of the outer layer 102 and configured for enclosing an electronic object 190 (shown in FIG. 1, only). EMI shielding container 100 may also include a closure 110 formed along the periphery 112 of the inside 104 of the outer layer 102 configured to collapse the inside 104 of the outer layer 102 on itself and around the internal pocket 108 in a closed configuration (FIG. 2) and that is also releasable to gain access to the electronic object 190 (FIG. 1).

The EMI shielding container 100 may include a closure 110 formed of hook and loop cloth fasteners according to an embodiment of the present invention. However, any other suitable closures 110 may be used according to other embodiments of the present invention. For example and not by way of limitation, closure 110 may be pressure sensitive adhesive, buttons, snaps, zippers or any other mechanism whereby the inside 104 of outer layer 102 may be closed against itself in a manner that is also selectively releasable.

The EMI shielding container 100 may include a means 114 for allowing an electrical interface (not shown in FIGS. 1-2) to communicate with the electronic object 190 (FIG. 1) within the EMI shielding container 100. The EMI shielding container 100 may include a closure 110 formed along the periphery 112 of the inside 104 of the outer layer 102 configured to allow passage of the electrical interface to the electronic object within the internal pocket 108 when the closure 110 is in the closed configuration according to an embodiment of the present invention. For example, the means 114 may be an opening not covered by a hook and loop closure 110, as shown in FIGS. 1-2. The electrical interface may be any suitable cable (not shown for clarity) that is configured to connect between the electronic object 190 having the data of interest and a data extractor (also not shown for clarity). The data extractor may be a laptop computer or any other suitable computer for receiving the data of interest.

The EMI shielding container 100 may include metalized fabric having at least one of: silver, nickel-silver, nickel-copper and nickel-copper-silver according to embodiments of the present invention. Various metalized fabrics suitable for embodiments of the present invention are available from Statex Productions & Vertriebs GmbH, Bremen, Germany and Shieldex Trading GmbH, New York, under the brand name of Shieldex®. Such metalized fabrics suitable for embodiments of the EMI shielding container 100 of the present invention may include Bonn-Shieldex® Silver Plated Fabric, Boston Silver-Plated Fabric, Kiel Copper Plated PBN-II (Non-Woven) Fabric, PF3151 RS Nickel-Silver Conductive Shieldex® Fabric, Nice Nickel-Copper Plated Shieldex® Fabric, Shieldex® Nora Nickel-Copper-Silver Fabric, Nora II Nickel-Copper Shieldex® Fabric, Norden Nickel-Copper Plated CEREX® Non-Woven Fabric and Tulle Silver-Plated Nylon Bobbinet Fabric, all available from Shieldex Trading GmbH, New York.

The internal pocket 108 and the EMI shielding container 100 may be configured in any suitable size according to embodiments of the present invention. For example and not by way of limitation, the internal pocket 108 may be configured to hold an electronic object 190 that is configured to communicate wirelessly, such as a cell phone or personal digital assistant (PDA). By placing such a wireless electronic object 190 into the EMI shielding container 100, wireless communications will be prevented, thus, maintaining the integrity of the data in the wireless electronic object 190 until it can be downloaded into a data extractor.

According to yet another embodiment of the EMI shielding container 100, the internal pocket 108 may further include hook and loop cloth fasteners to close an opening to the internal pocket 108. This feature allows the electronic object 190 to be secured within the internal pocket 108.

Figure 3:
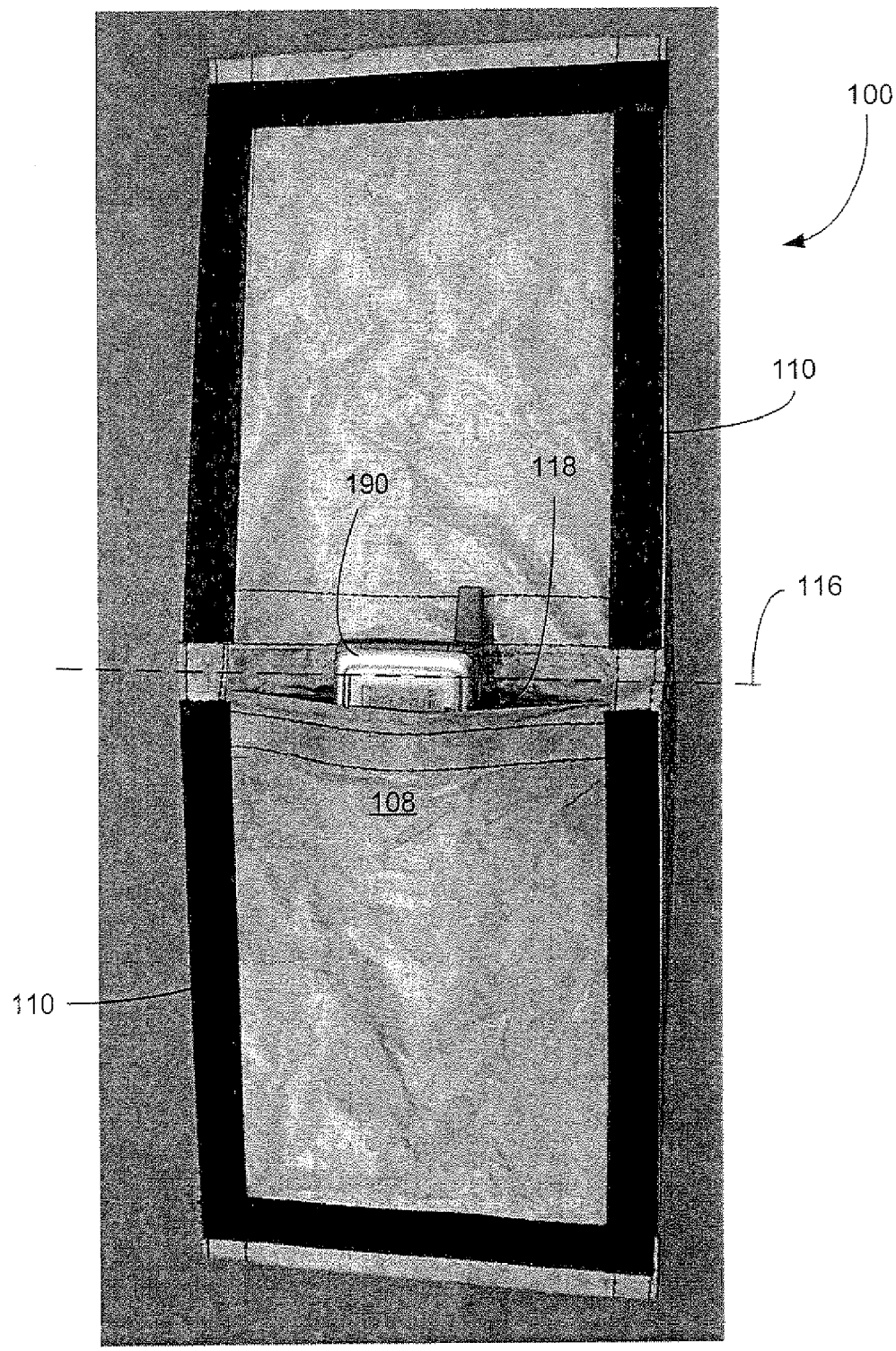
FIG. 3 is a photographic image of a top view of an EMI shielding container in an open configuration according to an embodiment of the present invention.
Figure 4:
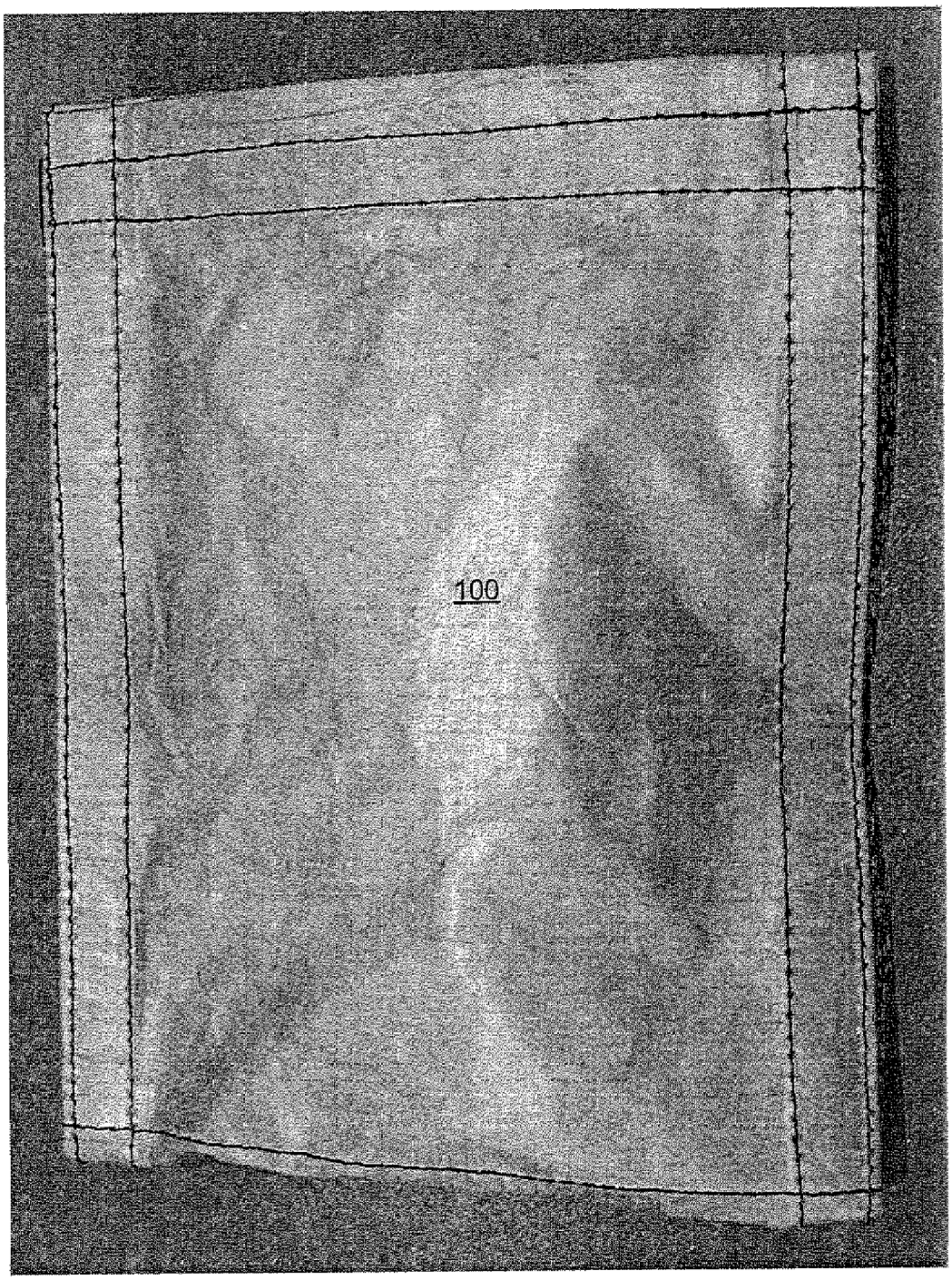
FIG. 4 is a photographic image of a top view of the EMI shielding container shown in FIG. 3 in a closed configuration according to an embodiment of the present invention.

FIG. 3 is a photographic image of a top view of an EMI shielding container 100 in an open configuration according to an embodiment of the present invention. As shown in FIGS. 1 and 3, an electronic object 190, such as a cell phone, may be placed in the internal pocket 108 at opening 118. The EMI shielding container 100 may then be folded generally along a center line 116 and sealed with closure 110. This feature of the EMI shielding container 100 provides double wrapping of the electronic object 190 once it is placed within the internal pocket 108 of the EMI shielding container 100 and folded along center line 116 and sealed with closure 110. FIG. 4 is a photographic image of a top view of the EMI shielding container 100 shown in FIG. 3 in a closed configuration according to an embodiment of the present invention.

Figure 5:
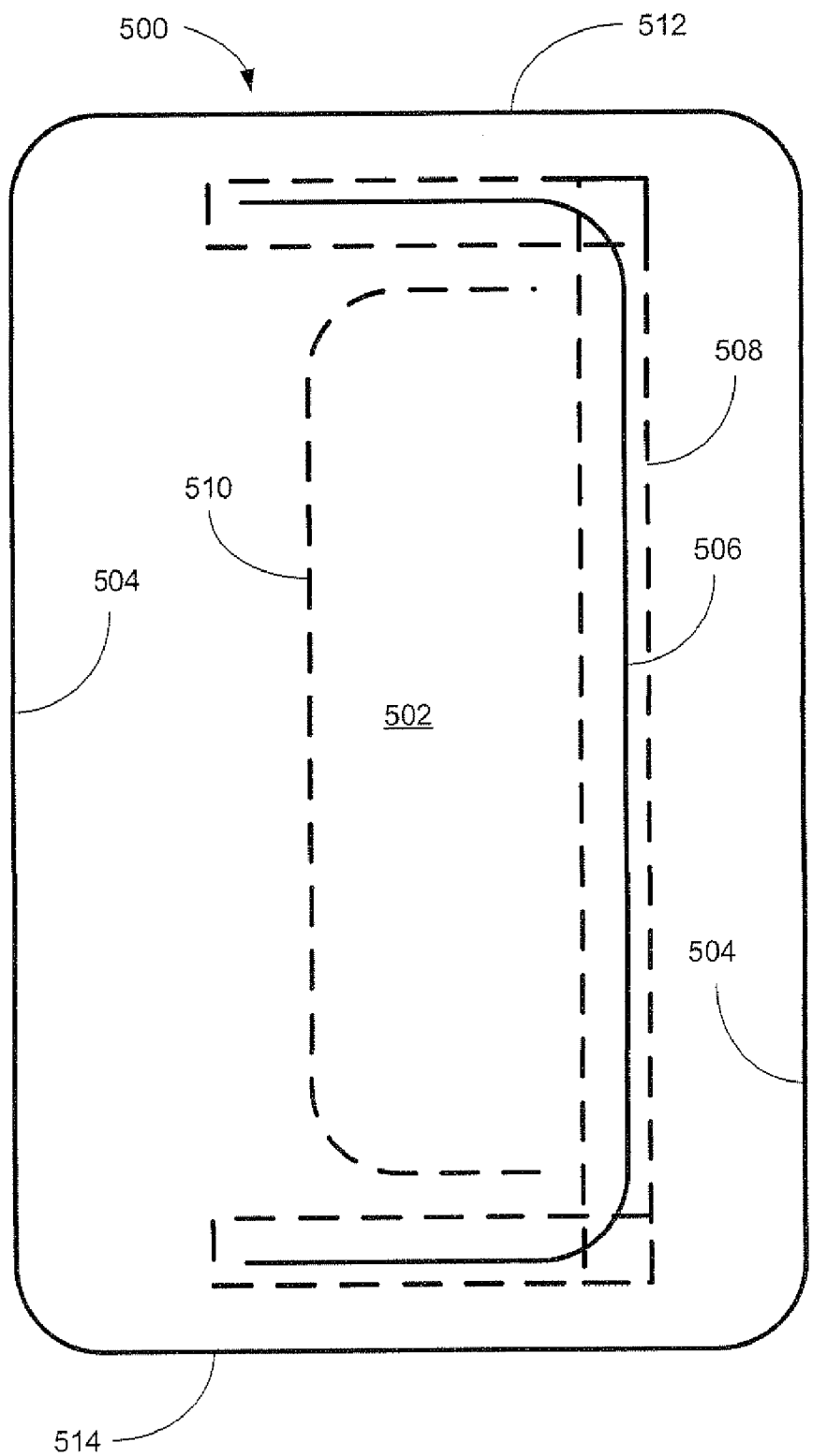
FIG. 5 is a diagram of embodiments of a portable electromagnetic EMI shielding container in accordance with the present invention.

FIG. 5 is a diagram of embodiments of a portable EMI shielding container, shown generally at 500, in accordance with the present invention. The EMI shielding container 500 may include a metalized fabric covering 502 and a framework 504 for supporting the metalized fabric covering 502 to form a tent structure enclosing a room, the room configured large enough to contain a user (not shown for clarity), a data extraction device (also not shown for clarity) and an electronic object being shielded (also not shown for clarity). The portable EMI shielding container 500 may further include an external closable opening 506 in the metalized fabric covering 502 allowing ingress and egress to the room within the EMI shielding container 500. According to one embodiment of the portable shielding container 500, the closable opening 506 may sealed with a flap 508 (shown in dotted line over closable opening 506) of the metalized fabric. The portable EMI shielding container 500 may further include a top or roof 512 and a bottom or floor 514. Both the roof 512 and floor 514 of the portable shielding container 500 may include the same metalized fabric as covering 502, according to embodiments of the present invention.

The closable external opening 506 may be a zipper according to an embodiment of the portable EMI shielding container 500. Of course, closable external opening 506 may be any suitable closure mechanism, consistent with the teachings of the present invention. For example and not by way of limitation, hook and loop closure cloth (Velcro®), buttons, snaps, pressure sensitive adhesive that is releasable and any other suitable closure mechanism known to one of ordinary skill in the art would all be suitable mechanisms for the closable external opening 506.

According to another embodiment of the EMI shielding container 500, flap 508 may be an inside panel (hidden from view by metalized fabric covering 502) with an inside closable opening 510 (shown in dotted line) that overlaps the external closable opening 506 in the metalized fabric covering 502. In this embodiment, the flap shown in dotted line as 508 in FIG. 5 would be unnecessary. The idea behind flap 508 is to cover the external closable opening 506 with the metalized fabric covering 502 in order to shield against EMI penetrating into the room through any portion of the external closable opening 506 that would otherwise be unshielded. Of course, it will be readily apparent to one of ordinary skill in the art, that shielding the external closable opening 506 with the metalized fabric covering 502 may be achieved in many different ways, all of which are considered to be within the scope of the present invention.

The metalized fabric covering 502 may include at least one of: silver, nickel-silver, nickel-copper and nickel-copper-silver, according to embodiments of the portable EMI shielding container 500 of the present invention. The metalized fabrics and sources for same described above with reference to EMI shielding container 100 are also suitable for the portable EMI shielding container 500 of the present invention.

The portable EMI shielding container 500 may further include a floor 514 including metalized fabric according to an embodiment of the present invention. According to yet another embodiment, floor 514 may include the metalized fabric inside two layers of protective material forming the inside and outside surfaces of the floor 514. The protective material may be, e.g., coated polyester, to protect the metalized fabric layer and to provide added durability.

The portable EMI shielding container 500 includes a framework 504 formed from any suitable material. For example and not by way of limitation, framework 504 may be formed of light weight conductive carbon fiber, steel, aluminum, Kapton or fiberglass rods. According to further embodiments, the rods of the framework 504 may be hollow. The framework 504 may be inserted through closable slots in a perimeter sleeve formed into the metalized fabric covering 502 according to one embodiment of the portable EMI shielding container 500 of the present invention. Alternatively, the framework 504 may be configured to suspend walls of the metalized fabric covering 502 from the inside of the room formed by the embodiment of the portable EMI shielding container 500 of the present invention. According to yet another embodiment, the framework 504 may be configured to suspend walls of the metalized fabric covering from outside of the room.

Figure 6:
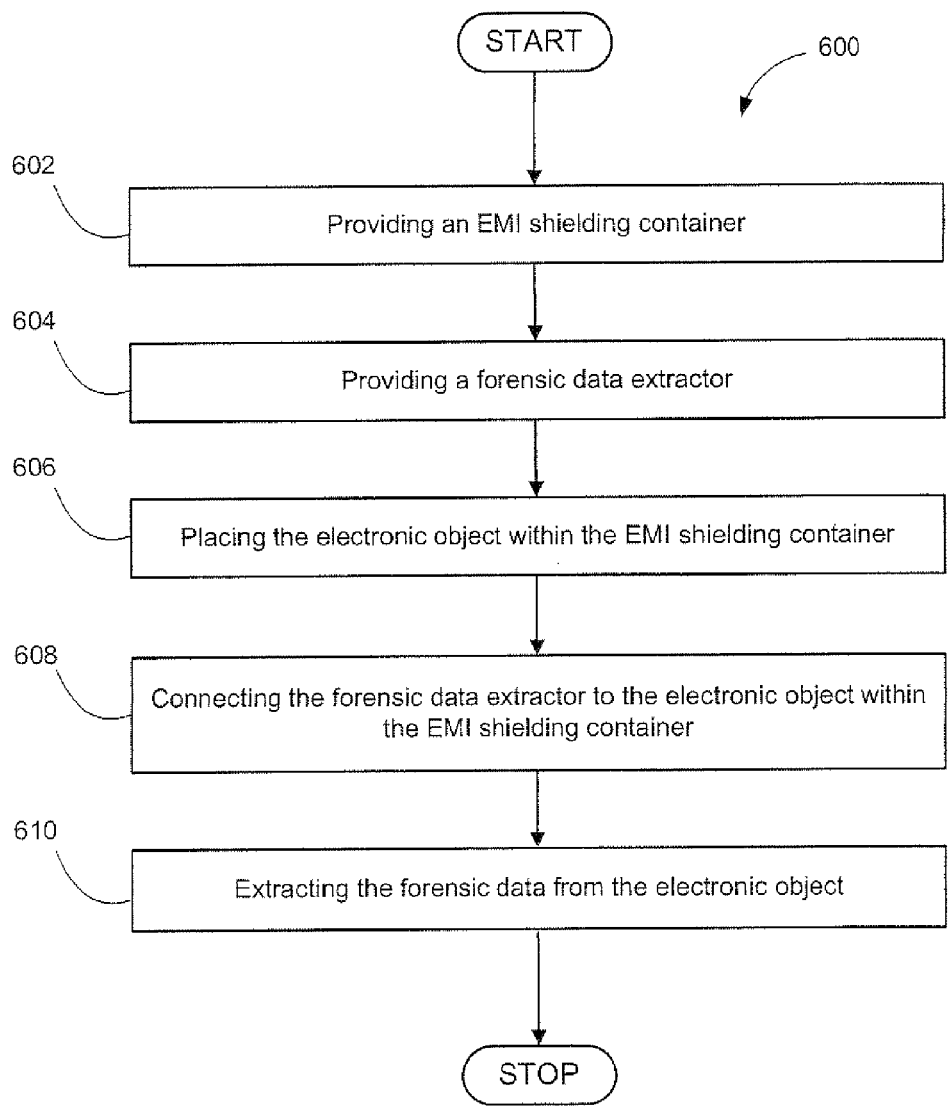
FIG. 6 is a flow chart of an embodiment of a method of using an EMI shielding container to extract forensic data from an electronic object according to the present invention.
Figure 7:
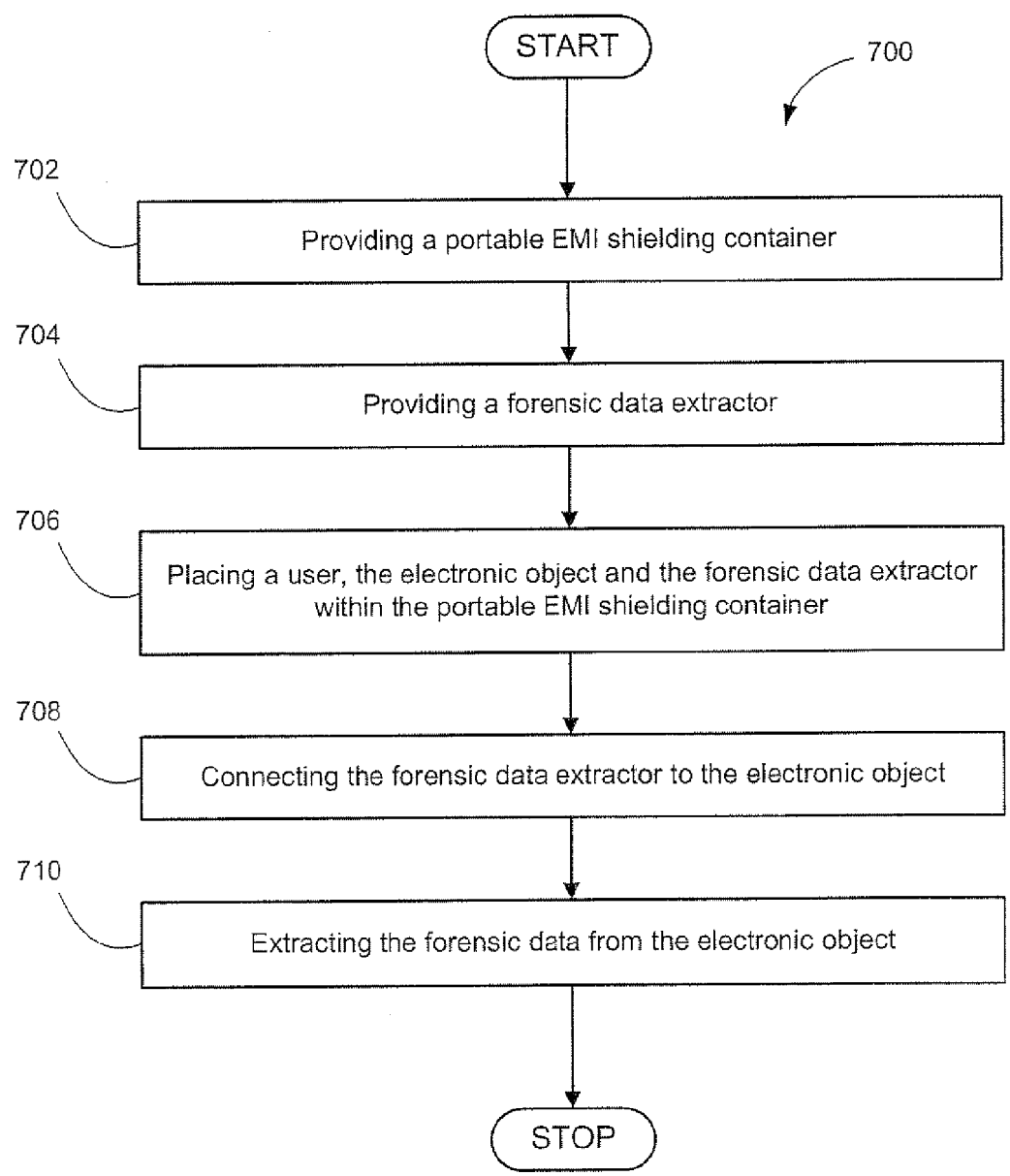
FIG. 7 is a flow chart of an embodiment of a method of using a portable EMI shielding container to extract forensic data from an electronic object according to the present invention.

FIG. 6 is a flow chart of an embodiment of a method 600 of using an electromagnetic interference (EMI) shielding container to extract forensic data from an electronic object is disclosed according to the present invention. Method 600 may include providing 602 an EMI shielding container and providing 604 a forensic data extractor. According to method 600, providing 602 the EMI shielding container may include providing an embodiment of a EMI shielding container 100 having features as described herein. The forensic data extractor may be any suitable computer with a suitable electronic interface, if necessary, for connecting to the electronic object of interest. Method 600 may further include placing 606 the electronic object within the EMI shielding container and connecting 608 the forensic data extractor to the electronic object within the EMI shielding container. Embodiments of the method 600 may include placing 606 the electronic object within the EMI shielding container before or after connecting 608 the forensic data extractor to the electronic object. Method 600 may further include extracting 610 forensic data from the electronic object. Extracting 610 forensic data may be accomplished in any suitable manner and is within the knowledge of one skilled in the art.

An embodiment of a method 700 of using a portable electromagnetic interference (EMI) shielding container to extract forensic data from an electronic object, is also disclosed according to the present invention. Method 700 may include providing 702 a portable EMI shielding container and providing 704 a forensic data extractor. Providing 702 the portable EMI shielding container may include providing an embodiment of a portable EMI shielding container 500 having features as disclosed herein. Method 700 may further include placing 706 a user, the electronic object and the forensic data extractor within the portable EMI shielding container. Placing 706 may be facilitated by using an external closable opening 506 as disclosed above. Method 700 may further include connecting 708 the forensic data extractor to the electronic object and extracting 710 the forensic data from the electronic object. Connecting 708 the forensic data extractor to the electronic object may be accomplished using an electronic interface, such as a cable, and as disclosed herein. Extracting 710 forensic data may be accomplished in any suitable manner and is within the knowledge of one skilled in the art.

While the foregoing advantages of the present invention are manifested in the illustrated embodiments of the invention, a variety of changes can be made to the configuration, design and construction of the invention to achieve those advantages. Hence, reference herein to specific details of the structure and function of the embodiments of the present invention are by way of example only and not by way of limitation.

What is claimed is:

1. An electromagnetic interference (EMI) shielding container, comprising:
   a first layer comprising a metalized fabric;
   a second layer of metalized fabric attached to the first layer to form an internal pocket between the first and second layers, the first layer folded over the second layer around a perimeter thereof to form an overlapping seam and wherein the internal pocket has an opening between the first and second layers configured to receive an electronic object and wherein at least a part of the first layer is folded over at least a part of the second layer along a non-opening edge of the internal pocket;

a third layer comprising a metalized fabric configured to substantially cover the opening between the first and second layers with the third layer in a closed configuration; and a releasable closure system configured to releasably attach at least a portion of the third layer to at least a portion of the first or second layer to substantially cover the opening between the first and second layers.

2. The EMI shielding container of claim 1, further comprising a means for allowing an electrical interface to communicate with the electronic object within the internal pocket of the EMI shielding container.

3. The EMI shielding container of claim 1, wherein the metalized fabric comprises at least one of: silver, nickel-silver, nickel-copper and nickel-copper-silver.

4. The EMI shielding container of claim 1, wherein the releasable closure system comprises hook and loop cloth fasteners.

5. The EMI shielding container of claim 1, wherein the third layer is configured to substantially cover the second layer of the inner pocket in the closed configuration.

6. The EMI shielding container of claim 1, wherein the first layer and the third layer are integrally formed.

7. The EMI shielding container of claim 6, wherein the third layer completely covers the second layer in the closed configuration.

8. The EMI shielding container of claim 7, further comprising hook and loop cloth fasteners for releasably closing the internal pocket.

9. The EMI shielding container of claim 8, wherein the hook and loop cloth fasteners are disposed substantially completely around the outer perimeter of the outer second and third layers to allow the outer perimeter of the third layer to be releasably joined to the outer perimeter of the second layer in the closed position.

10. The EMI shielding container of claim 1, wherein the first layer is joined to the second layer with a pair of spaced-apart parallel seams.

11. An electromagnetic interference (EMI) shielding container, comprising:

an outer layer comprised of a metalized fabric having an inside and an outside;

an inner layer comprised of a metalized fabric having an inside and an outside;

an internal pocket comprised of the metalized fabric on the inside of the outer layer and the inside of the inner layer, wherein the internal pocket comprises an opening configured to receive an electronic object, the outer layer folded over the inner layer around a perimeter of the inner layer to form an electromagnetically shielded seam; and a releasable closure system formed at least in part along a periphery of the outer layer, wherein the releasable closure system is configured to releasably extend the metalized fabric of the outer layer over at least a portion of the opening to the internal pocket to prevent external signals from entering through the at least a portion of the opening.

12. The EMI shielding container of claim 11, further comprising a means for allowing an electrical interface to communicate with an electronic object within the internal pocket of the EMI shielding container.

13. The EMI shielding container of claim 11, wherein the metalized fabric of the outer layer comprises at least one of: silver, nickel-silver, nickel-copper and nickel-copper-silver.

14. The EMI shielding container of claim 11, wherein the releasable closure system comprises hook and loop cloth fasteners.

15. The EMI shielding container of claim 11, wherein the internal pocket comprises three sides formed by folding the outer layer over the inner layer.

16. The EMI shielding container of claim 11, wherein the internal pocket further comprises hook and loop cloth fasteners configured to close the opening in the internal pocket.

17. The EMI shielding container of claim 11, wherein an inside of the outer layer completely covers an outside of the inner layer in a closed configuration.

18. The EMI shielding container of claim 17, wherein hook and loop cloth fasteners are disposed substantially completely around the outer perimeter of the portion of the outer extending over the inner layer and around the outer perimeter of the inner layer to releasably join the outer layer to the inner layer in the closed position.

19. The EMI shielding container of claim 11, wherein the outer layer is joined to the inner layer with a pair of spaced-apart parallel seams.

* * * * *